United States Patent [19]

Liu et al.

[11] Patent Number: 5,045,639
[45] Date of Patent: Sep. 3, 1991

[54] PIN GRID ARRAY PACKAGE

[75] Inventors: Henry Liu; Heinz Ru, both of Taipei, Taiwan

[73] Assignee: Tong Hsing Electronic Industries Ltd., Taipei, Taiwan

[21] Appl. No.: 570,332

[22] Filed: Aug. 21, 1990

[51] Int. Cl.$^5$ .............................. H01L 23/02
[52] U.S. Cl. ...................... 174/52.4; 357/74
[58] Field of Search ......... 361/380, 397, 399; 174/52.4, 262, 263, 264, 265, 266; 357/74, 80

[56] References Cited

U.S. PATENT DOCUMENTS

| | | | |
|---|---|---|---|
| 4,072,816 | 2/1978 | Gedney et al. | 174/52.4 |
| 4,458,291 | 7/1984 | Yanagisawa et al. | 361/212 |
| 4,823,234 | 4/1989 | Konishi et al. | 361/386 |
| 4,861,944 | 8/1989 | Jones, II et al. | 174/250 |
| 4,941,582 | 7/1990 | Morikawa et al. | 220/2.1 R |

*Primary Examiner*—Leo P. Picard
*Assistant Examiner*—Bot Lee Ledynh
*Attorney, Agent, or Firm*—Bacon & Thomas

[57] ABSTRACT

A pin grid array package having a substrate formed from a ceramics containing a 90% or higher alumina composition. The substrate has an palladium-silver layer on an upper surface thereof with a silver layer further provided on the Pd-Ag layer and a gold bonding pad on a outer periphery of a cavity of the substrate so as to provide electrical connection between pins and chip. The Ag layer is covered with a dielectric layer to prevent contamination from moisture.

1 Claim, 2 Drawing Sheets

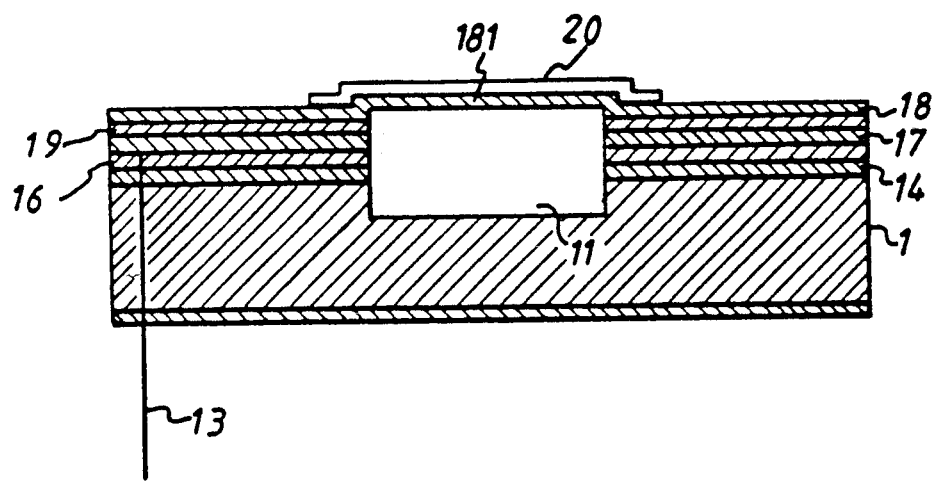
FIG_2.

PIN GRID ARRAY PACKAGE

BACKGROUND OF THE INVENTION

The present invention relates to the art of packaging integrated circuit chips. More particularly, the present invention relates to improved packages for hermetically securing integrated circuit chips with high pin counts to an isolated environment.

Integrated circuit packages comprise an integrated circuit chip that has been encapsulated in a protective material such as plastic or ceramic. These packages can be with or without leads. In the former, electrical conductors extend from the encapsulant as a means for sending signals to and receiving signals from the chip; whereas in the latter, communication with the chip is accomplished by electrical pads that lie flush with the encapsulant.

The manufacturing technique of the pin grid array packages available nowadays involves the use of either plastics or ceramics. In the case of plastic material, poor heat transfer renders it inappropriate for use under high temperatures and high power applications. Also, it does not possess a desired hermiticity and humidity-resistance. With the substrate of plastic material in contact with the gold line and IC chip, different thermal expansion factors therebetween result in poor resistance to temperature cycling. In the case of ceramic material, the manufacturing is a co-fire process which combines alumina or other suitable material and binder to form the slip and then the green tape. Next, desired circuitry is screened on the green tape which in turn is punched to make connections for several layers of green tapes. The several layers of green tapes are laminated together and heat treated under reduced atmosphere. Next, the pins are fixed in position by copper/silver brazing and metal is plated thereon. After die bonding and wire bonding, a kovar cover with gold/tin preform is soldered to the gold plated seal ring on top of the ceramic package, at about 310 degrees Celsius.

The above process for ceramic material has the following shortcomings:

(1) Mg-Mo alloy or W, which is used for the desired circuitry in the co-fire process, has high ohmic resistance which reduces the signal transmission speed and cannot meet the high-speed signal processing requirements of today.

(2) Conventional co-fire process is performed under reduced atmosphere in a nitrogen/hydrogen environment which demands high cost.

(3) Co-fire substrates are formed with green tapes using binders of the solvent type which are expensive and liable to pollute the environment.

(4) Molds used for punching connection between the different layers are expensive to manufacture and difficult to modify.

It is the purpose of this present invention, therefore, to overcome the above drawbacks and to provide an improved pin grid array (package) in the manner set forth in the following detailed description.

SUMMARY OF THE INVENTION

It is an object of this invention to provide a low ohmic resistance and low cost pin grid array package which can be manufactured efficiently without contaminating the environment.

A further object of this invention is to provide a pin grid array package having a palladium-silver layer applied to an upper surface of a substrate and a silver layer applied to the palladium-silver layer in order to provide a low ohmic resistance circuitry for improved signal transmission. Gold plated copper pins and the palladium-silver thick film metalization are connected by spot welding to form the gold/copper/silver alloy at very high temperature. This alloy can resist high temperature treatment in the follows on processing.

Another object of this invention is to provide a multi-layered pin grid array package which can be processed in normal atmospheric environment so as to reduce manufacturing costs.

Yet a further object of this invention is to provide a pin grid array package which utilizes ceramics formed by a dry-molding method using a dry powder mixed with solvent type binders. This process demands lower costs and will not contaminate or pollute the environment.

These and additional objects, if not set forth specifically herein, will be readily apparent to those skilled in the art from the detailed description provided hereinbelow, with appropriate reference to the accompanying drawings.

BRIEF DESCRIPTION OF THE DRAWINGS

FIG. 2 is a diagrammatic representation of the pin grid array package of the invention.

DETAILED DESCRIPTION OF THE PREFERRED EMBODIMENT

Figure 1:
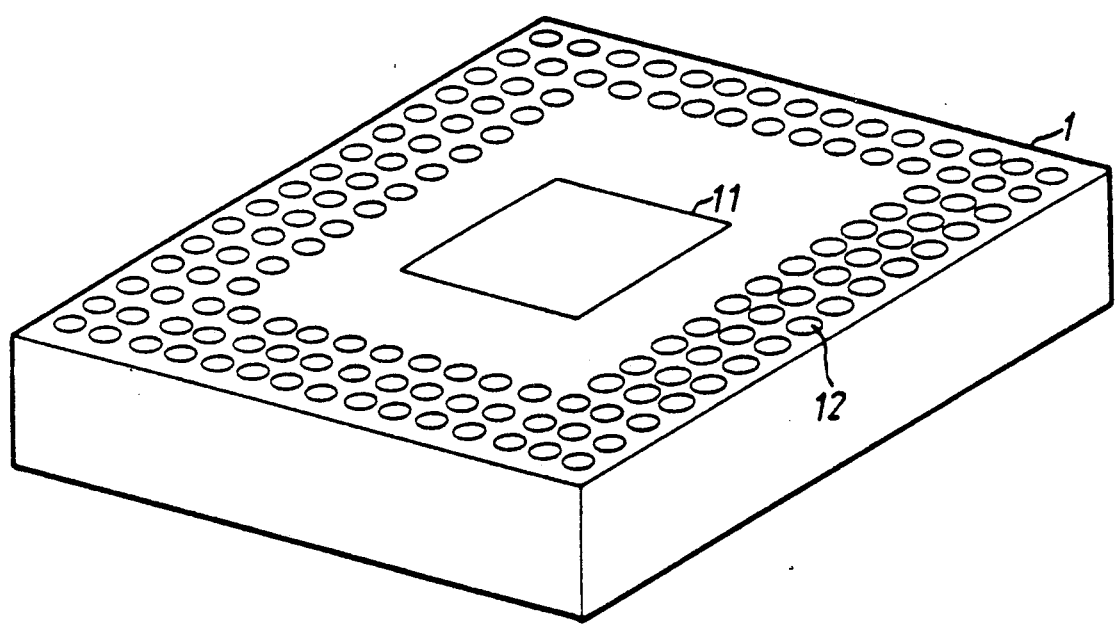
FIG. 1 is a perspective view of a substrate.

Referring to FIG. 1, there is generally shown the preferred form of the substrate, generally referred to as numeral 1, in accordance with this invention. The substrate 1 is made out of ceramics containing at least a 90% concentration of $Al_2O_3$ and formed by a dry molding method. A substantially rectangular cavity 11 is formed in center of the substrate 1 and is large enough to serve as a receptacle for receiving a chip (not shown). A plurality of holes 12 are formed through the substrate 1 simultaneously and are orderly arranged in rows and columns starting from the cavity 11 and extending to the edge of the substrate 1. Pins 13 are engaged in the holes 12 and connected electrically by welding process to the Pd/Ag layer 14, as shown in FIG. 2.

FIG. 2 shows the substrate 1 with additional layers in accordance with this invention. The layers are applied using a thick-film method, and the sequence of the application will be subsequently described.

The first layer to be applied to the substrate 1 is the palladium/silver (Pd/Ag) layer 14. To the upper surface of the Pd/Ag layer 14, a silver (Ag) layer 16 is applied and extends into the inner periphery of the cavity 11 and serves as a conductant between the pins 13 and the chip received in cavity 11. A dieletric layer 17 is then added to the upper surface of the Ag layer 16 and prevent moisture contamination thereof.

The remaining two layers are a sealing glass layer 19 and a window frame 18. The window frame 18 has the sealing glass layer 19 applied to the underside thereof and also has an upper recess 181 formed therein which is correspondingly located directly over the cavity 11 to accommodate the chip from above. The window frame 18 and the sealing glass layer 19 are located on the dielectric layer 17 and encompass the dielectric layer 17 as well as the chip received in the cavity 11.

Covering the upper recess 181 is a preform Kovar cover with gold/tin perform 20, used to seal the cavity 11 and upper recess 181 hermetically to offer protection for the chip.

The pins 13 extend through the holes 12 at the substrate 1 and are welded to the Pd/Ag conductor which is connected to the Ag traces and Au bonding pads. These pads are connected to the IC chips by wire bonding to form electrical conductance. The pins 13 are made from a copper material for conduction and plated with nickel and gold.

While the present invention has been explained in relation to its preferred embodiment, it is to be understood that various modifications thereof will be apparent to those skilled in the art upon reading this specification. Therefore, it is to be understood that the invention disclosed herein is intended to cover all such modifications as shall fall within the scope of the appended claims.

I claim:

1. A pin grid array package comprising:

- a substrate being made out of a dry molded ceramic with at least a 90% concentration of $Al_2O_3$, and formed by using a thick-film method, said substrate having a cavity adapted for receiving a chip, a plurality of through-holes drilled for receiving pins made from a copper material and plated with Ni and Au, a Pd/Ag layer with a donut shape surrounding all said through-holes on an upper surface of said substrate;
- an Ag layer being provided as traces to form connection between said upper Pd/Ag layer and Au bonding pads provided on an outer periphery of said cavity of said substrate, which provide electrical connection between the pins and chip, a dielectric layer being provided on said Ag layer to prevent migration and contamination from moisture; and
- a window frame with a sealing glass formed on a lower surface thereof being provided to encompass said dielectric layer and the chip received in said cavity of said substrate.

* * * * *